United States Patent

Sudo

[11] Patent Number: 5,863,837
[45] Date of Patent: Jan. 26, 1999

[54] METHOD OF MANUFACTURING SEMICONDUCTOR DEVICE

[75] Inventor: Akira Sudo, Kanagawa-ken, Japan

[73] Assignee: Kabushiki Kaisha Toshiba, Kawasaki, Japan

[21] Appl. No.: 822,921

[22] Filed: Mar. 21, 1997

[30] Foreign Application Priority Data

Mar. 22, 1996 [JP] Japan ................................. 8-066753

[51] Int. Cl.⁶ ........................................................ H01L 21/00
[52] U.S. Cl. ........................... 438/692; 438/738; 438/697; 438/197
[58] Field of Search ........................................... 438/633, 691, 438/692, 696–697, 720, 724, 723, 738, 742, 744, 747, 754, 756, 757, 197; 216/38, 41, 67, 88

[56] References Cited

U.S. PATENT DOCUMENTS 4,822,754  4/1989  Lynch et al. ........................ 438/705 X
5,231,051  7/1993  Baldi et al. ......................... 438/743 X

*Primary Examiner*—William Powell
*Attorney, Agent, or Firm*—Banner & Witcoff

[57] ABSTRACT

This invention is related to a method of manufacturing a semiconductor including a MOSFET.

The method comprises a step of forming an opening in a first insulating layer covering a second insulating layer and a surface of semiconductor substrate, so that the second insulating layer covering a gate electrode, and a surface of a source region and a drain region are exposed, a step of burying a conductive material in the opening, and a step of etching the conductive material so that a surface of the second insulating layer is exposed.

13 Claims, 6 Drawing Sheets

METHOD OF MANUFACTURING SEMICONDUCTOR DEVICE

FIELD OF THE INVENTION

The present invention relates to a method of manufacturing a semiconductor device including a MOSFET.

BACKGROUND OF THE INVENTION

With the sharp increase in semiconductor equipment integration, the MOS transistors tend to be more miniaturized.

Figure 1A:
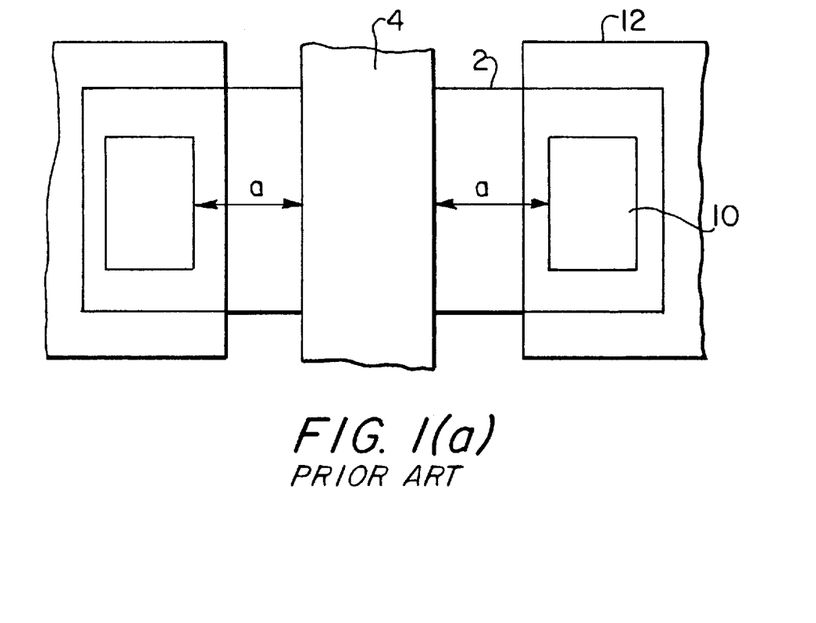
FIGS. 1(a) and 1(b) are a plan view, respectively, and sectional view of a first structure of conventional MOSFET.
Figure 1B:
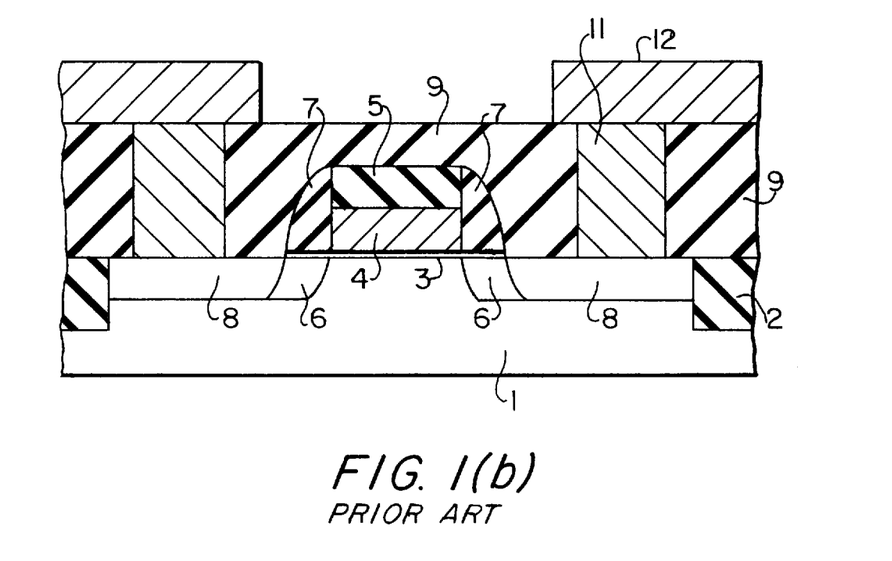

FIGS. 1 (a) and (b) show a top view and a sectional view, respectively, for a conventional MOS transistor structure. The conventional MOS transistor consists of the following elements:
1. Gate electrode 4, formed on the device field of semiconductor substrate 1 through gate oxide layer 3;
2. Source region and drain region 8; and
3. Contacting electrode 11, formed to connect to the source region and drain region 8.

In addition, the MOS transistor shown in FIG. 1 is equipped with a wiring layer 12 to connect to a contacting electrode 11. The wiring layer 12, the contacting electrode 11, and the gate electrode 4 are electrically isolated by an interlayer insulating layer 9. The source region and drain region 8 consist of the following elements:

The first diffusion layer 6, formed by diffusing impurities on the device field surface other than the gate electrode 4, and the second diffusion layer 8, formed by diffusing impurities on the device field surface other than the region, where an insulating layer 7 formed on the side-wall of the gate electrode 4 is grown. The source region and drain region 8 are referred to as Lightly Doped Drain structure for the above structure.

In a conventional MOS transistor having such a structure, it is required to increase the separation between the contacting electrode 11 and the gate electrode 4, in order to prevent short-circuiting between two electrodes. Accordingly, the MOS transistor needs a larger proportion of the surface area compared to the whole semiconductor equipment. Therefore, it is impossible to achieve higher semiconductor equipment integration. Furthermore, the separation between the contacting electrode 11 and the gate electrode 4 is so large that it increases the parasitic resistance due to the source region or drain region 8. As transistors are being miniaturized, resistance of the channel region decreases. Thus, the proportion of the parasitic resistance to the resistance of the channel region increases. In other words, the above parasitic resistance causes unusual deterioration in the drive power for transistors.

Figure 2A:
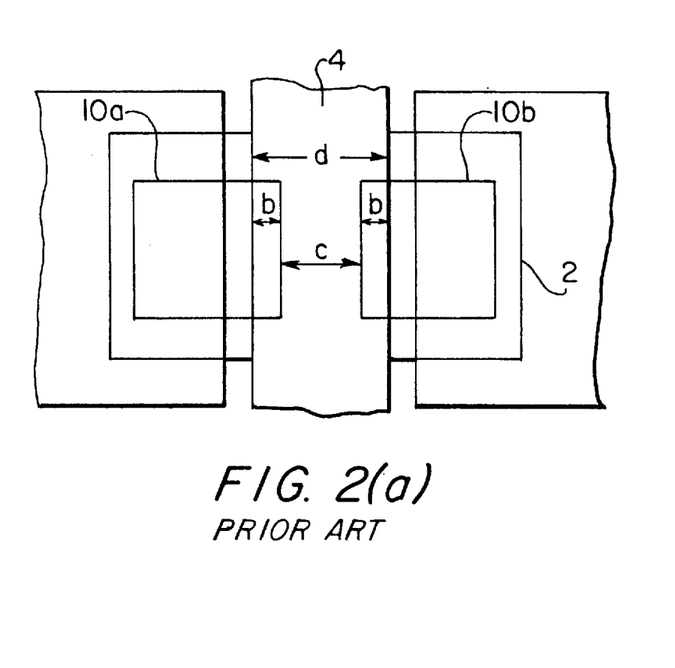
FIGS. 2(a) and 2(b) are a plan view, respectively, and sectional view of a second structure of conventional MOSFET.
Figure 2B:
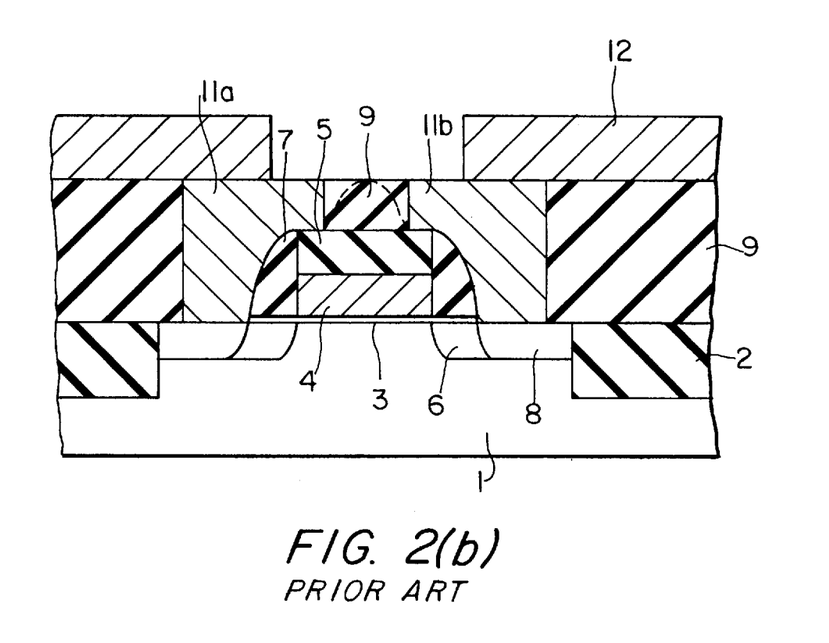

To solve the aforesaid problems, the position of the contacting electrode 11 is aligned to the gate electrode 4 in the semiconductor equipment shown in FIG. 2. This structure is referred to as SAC (Self Align Contact) structure. FIG. 2 (a) shows a top view and (b) shows a sectional view, respectively, for MOS transistors having the SAC structure. The insulating layer 5 and the side-wall insulating layer 7 cover the gate electrode 4 to prevent short-circuiting between the contacting electrode 11 and the gate electrode 4.

Figure 3A:
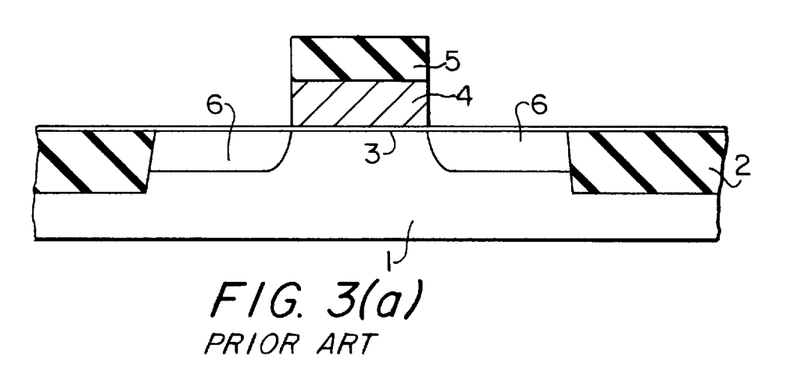
FIGS. 3(a)–3(c) are sectional views of each step of manufacturing the second structure of conventional MOSFET.

FIG. 3 shows a sectional view for a method to manufacture the MOS transistor having the SAC structure. The gate insulating layer 3, the gate electrode 4, and the insulating layer 5 are formed in sequence on the semiconductor substrate 1, where a device isolation field 2 was formed. Thereafter, the first diffusion layer 6 is formed on a portion other than this gate electrode 4 and this insulating layer 5, using the ion implantation method. (FIG. 3 (a))

Figure 3B:
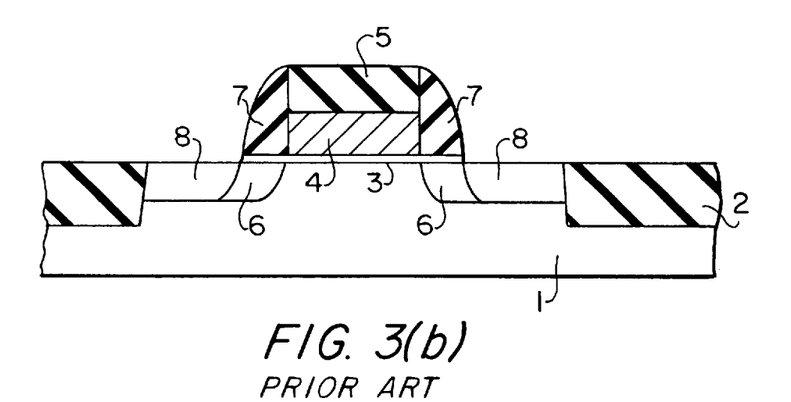

Next, for example, insulating layers are stacked so as to cover the gate electrode 4. After the insulating layers are formed, the insulating layers on the semiconductor substrate 1 are removed, using the anisotropic etching method, thereby forming the insulating layer 7 on the side-wall of the gate electrode 4. Further, the second diffusion layer 8 can be formed, for instance, using the ion implantation method. (FIG. 3(b))

Figure 3C:
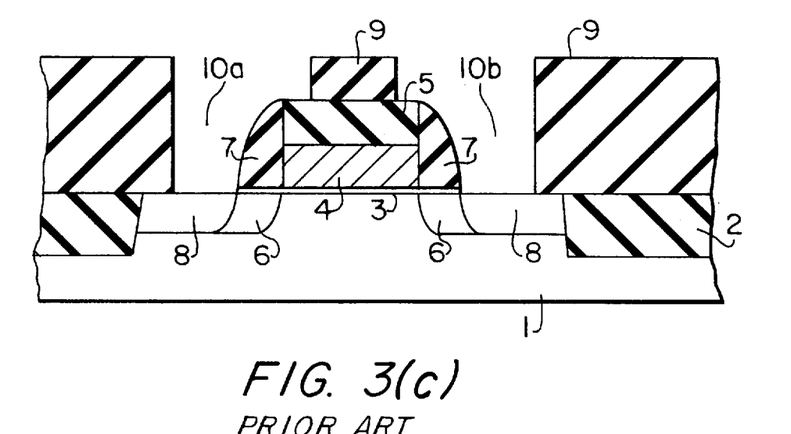

Thereafter, the interlayer insulating layer 9 is formed over the entire surface of semiconductor substrate 1. Further, contacting holes 10a and 10b are opened within the interlayer insulating layer 9 by the normal lithography technique and the anisotropic etching method (FIG. 3(c)). At this time, the anisotropic etching should be performed under the condition where an etching speed to the insulating layers 5 and 7 is slower than that to the interlayer insulating layer 9. This enables the insulating layers 5 and 7 to remain, as shown in FIG. 3(c). Therefore, there is no need to increase the separation between the contacting holes 10a, 10b, and the gate electrode 4, even if an overlay offset (an overlay offset between predetermined clearance region of the contacting holes 10a and 10b, and the actual clearance region) occurs.

Subsequently, the contacting electrode 11 is formed by embedding tungsten etc. into the contacting holes 10a and 10b. Wiring 12 is formed on the upper area of the contacting electrode 11 by using Al, etc., thereby producing the MOS transistor, as shown in FIG. 2 (b).

As described above, the conventional MOS transistor having the SAC structure can reduce the separation between the contacting holes 10a/10b and the electrode 4, which can miniaturize the MOS transistor. On the other hand, the separation between the channel region and the contacting electrode 11 of the MOS transistor is shortened, so that the parasitic resistance can be reduced. Particularly, as shown in FIG. 2 (a), the pattern for the contacting hole 10 is formed so as to overlap with the gate electrode 4 pattern, which enables the separation between the channel region and the contacting electrode 11 to be equal to the width of side-wall insulating layer 7. Therefore, the parasitic resistance, due to the source region or drain region 8, can be miniaturized.

Meanwhile, in order to minimize the parasitic resistance, as described above, it is required to overlay the connecting holes 10a, 10b and the gate electrode 4 each other, as shown in FIG. 2 (a), by at least overlay offset separation b for the aforesaid contacting holes 10a and 10b. At this time, the separation c between the contacting holes 10a and 10b is expressed by Equation: $c=d-2\times b$, in the case when the gate electrode 4 width is specified at d.

Generally, many cases used to miniaturize the transistor provide the width for the gate electrode 4 with a critical minimum size, so that the gate electrode pattern can be formed. Therefore, the separation between the contacting holes 10a and 10b will be shorter than a critical minimum size for fabrication of gate electrode, which makes it very difficult to simultaneously pattern the contacting holes 10a and 10b. assuming discretely patterning the contacting holes 10a and 10b, a problem will occur in which the number of manufacturing processes increase. Furthermore, it can not be assured that the cross section of the interlayer insulating layer 9, between the contacting holes 10a and 10b, appears in a rectangular shape, as shown in FIG. 2 (b), which causes to short the contacting electrodes 11a and 11b formed inside of the holes 10a and 10b. Thus, it is necessary to take new measures to avoid the aforesaid problems.

As described above, the conventional manufacturing method used for semiconductor equipment was found to make it difficult to simultaneously align predetermined contacting holes located at both ends of the gate electrode for the gate electrode.

SUMMARY OF THE INVENTION

It is an object of the present invention to align an opening for source electrode and for drain electrode to a gate electrode in one step.

To achieve the above object, the present invention provides a method of manufacturing a semiconductor device, comprising a step of forming an opening in a first insulating layer covering a second insulating layer and a surface of semiconductor substrate, so that the second insulating layer covering a gate electrode, and a surface of a source region and a drain region are exposed, a step of burying a conductive material in the opening, and a step of etching the conductive material so that a surface of the second insulating layer is exposed.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

A more complete appreciation of the present invention and many of its attendant advantages will be readily obtained by reference to the following detailed description considered in connection with the accompanying drawings, in which.

DETAILED DESCRIPTION OF PREFERRED EMBODIMENTS

Embodiments of the present invention will be described in detail with reference to the drawings.

Figure 4A:
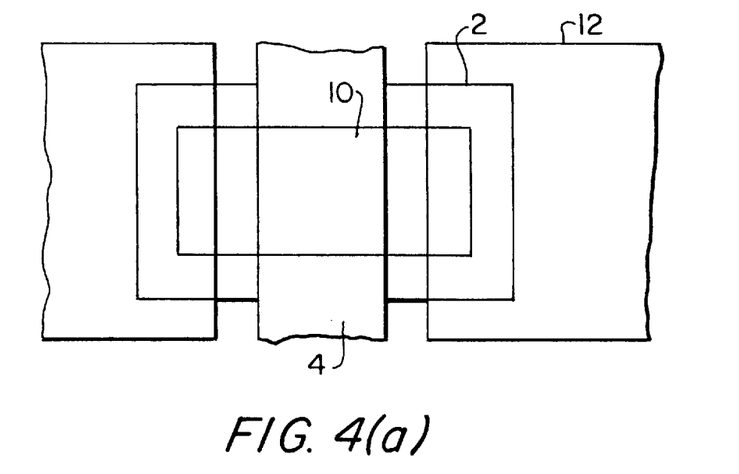
FIGS. 4(a) and 4(b) are a plan view, respectively, and sectional view of a structure of a semiconductor device according to a first embodiment.
Figure 4B:
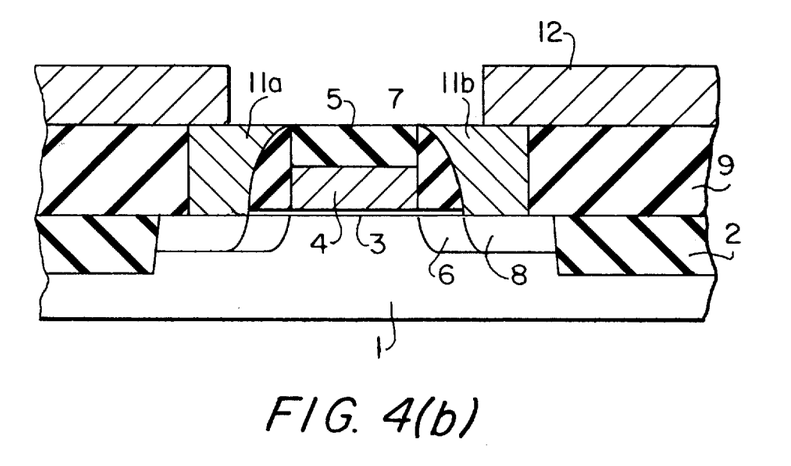

FIG. 4(a) shows a top view for the structure of a semiconductor equipment manufactured according to the first embodiment of the present invention, while FIG. 4 (b) shows a sectional view thereof.

In this embodiment, the contacting holes 10 are formed as a pattern where both ends of the gate electrode 4 cross, as shown in FIG. 4 (a), unlike the conventional manufacturing method, where contacting holes 10 are formed as a pattern, which separately exists on both ends of the gate electrode 4.

Further, the contacting electrodes 11a and 11b are isolated by the interlayer insulating layer 9, according to the conventional method, while the contacting electrodes 11a and 11b are isolated by the gate electrode 4, the insulating layer 5, and the insulating layer 7, according to this embodiment, as shown in FIG. 4 (b). In the conventional MOS transistor, as shown in FIG. 2, the width d of the gate electrode 4 is considered the critical minimum size, as described above. Thus, the width of the interlayer insulating layer 9 on the insulating layer 5 is less than the critical minimum size. Accordingly, in fact a cross section of the interlayer insulating layer 9 on the insulating layer 5 has the shape, indicated with dotted lines in FIG. 2, while the upper portion of the interlayer insulating layer 9 on the insulating layer 5 has only a width less than c. As a result, it is difficult to maintain insulation between the contacting electrodes 11a and 11b. On the other hand, in this embodiment, a separation between the contacting electrodes 11a and 11b is at least the width d of the gate electrode 4. Therefore, it is possible to assure insulation between the contacting electrodes 11a and 11b.

Figure 5A:
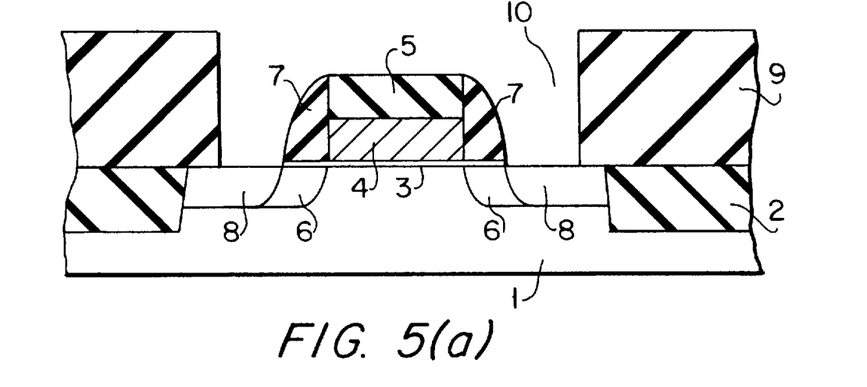
FIGS. 5(a)–5(c) are sectional views of each step of manufacturing the semiconductor device according to the first embodiment.
Figure 5B:
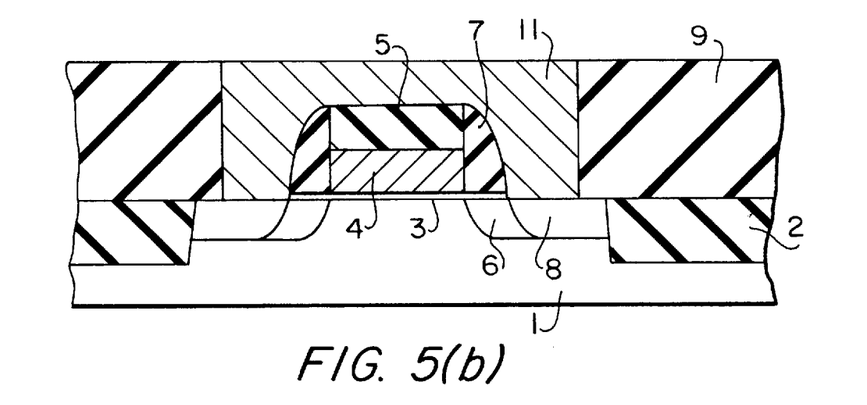
Figure 5C:
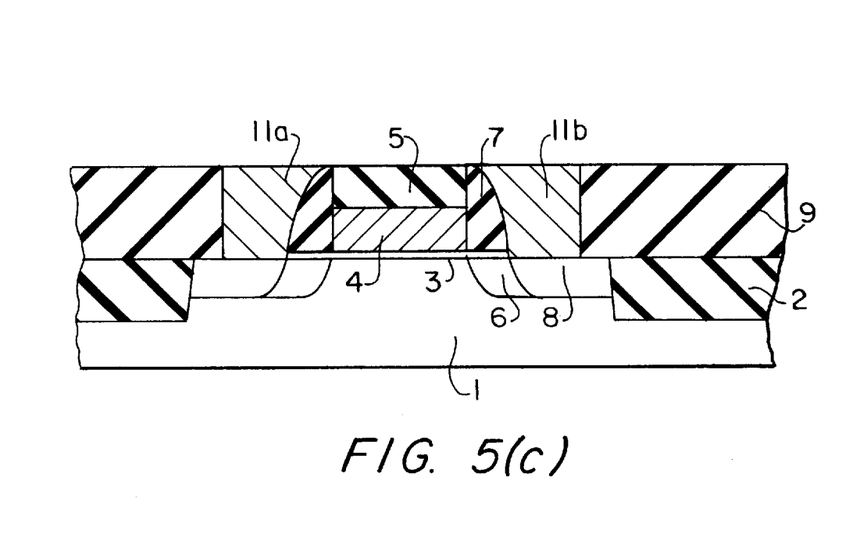

Next, a manufacturing method for semiconductor equipment according to the first embodiment of this invention will be explained, referring to FIG. 5.

A device isolation field 2 was formed on the semiconductor substrate 1 for separating the surface of the semiconductor substrate 1. The part of surface between the device isolation field 2 is used as device field. The gate oxide layer 3, the gate electrode 4, and the insulating layer 5 are formed in sequence on the surface of the device field. The side-wall insulating layer 7 is formed along the side surface of gate electrode 4 and the insulating layer 5. The source region and drain region 8 are formed on the device field surface, which is not covered with the side-wall insulating layer 7 and the gate electrode 4. Further, the interlayer insulating layer 9 is formed over the entire surface of the semiconductor substrate 1. Forming processes are detailed in steps as follows.

Grooves are formed on a p-type Si semiconductor substrate 1, and an insulation material, such as oxide layer ($SiO_2$), are buried therein, in order to form the device isolation field 2. Needless to say, these grooves include those formed by combining shallow and deep grooves, the so-called shallow-trench technique. This device isolation field can also be formed by the LOCOS (Local oxidation) method.

Next, a thermal oxide layer (gate insulating layer 3) having a thickness of 10 nm is formed on the surface of semiconductor substrate 1, for example by heating the semiconductor substrate 1 to about 950° C. On the gate insulating layer 3, about a 100 nm thick polycrystalline silicon layer, to which n-type impurities, such as phosphorous are added, is formed by such a LP-CVD (Low-pressure Chemical Vapor Deposition) method. Further, an about 150 nm thick silicon nitride layer is formed by such an LP-CVD method. The polycrystalline silicon layer and the silicon nitride layer can be formed within the same chamber by varying the source gas.

After that, an etching mask made of materials such as a resist is formed on the said silicon nitride layer, by a normal lithography method. Then, an anisotropic etching method such as RIE (Reactive Ion Etching) is employed to form the gate electrode 4 and the insulating layer 5 by etching the silicon nitride layer and the polycrystalline silicon layer, which are not covered with the etching mask. In addition, the gate electrode 4 can be formed by a metallic layer with a high-melting point, such as tungsten (W), or by a silicide layer such as tungsten silicide (WSi).

Next, an n-type impurity, such as phosphorous, is implanted over the entire surface of semiconductor substrate 1. Herein, the insulating layer 5 and gate electrode 4 work as a mask for the implantation of n-type impurities to the semiconductor substrate 1. In this manner, the first diffusion layer 6 is formed.

Subsequently, for example, a 50 nm thick silicon nitride layer is deposited over the entire surface of semiconductor substrate including the gate electrode 4 by the LP-CVD method. Then, the silicon nitride layer n the insulating layer 5 is removed by an anisotropic etching method, such as RIE, thereby forming the side-wall insulating layer 7. Next, if necessary, an n-type impurity, such as arsenic, is ion-implanted in the surface of the semiconductor substrate to form the second diffusion layer 8.

Moreover, about a 400 nm thick insulating layer (interlayer insulating layer 9), consisting of $SiO_2$, is deposited by reaction (thermally isolating) of such TEOS (tetraethoxysilane). $SiO_2$ is employed in this embodiment, besides, BPSG (Boron Phospho Silicate Glass) is applicable.

Further, a resist layer, which has an opening in the shape of the pattern (outline 2) crossing over both ends of gate electrode 4, is formed, as shown in FIG. 4(a). Then, the source region and drain region 8 are exposed by anisotropic-etching interlayer insulating layer 9 using the etching mask. Reactive ion etching using $C_4F_8$+CO gas is applied as the anisotropic etching method. In such manner contacting holes 10 is formed (FIG. 5(a)). At this time, etching is carried out under a condition where the etching speed for the insulating layers 5 and 7 is lower than that for the interlayer insulating layer 9, so that the contacting holes can be formed in a situation, where the insulating layers 5 and 7 covering the gate electrode 4 remains. When the RIE is employed to expose the surface of the source region and drain region 8, there is a fear that the gate oxide layer will be damaged resulting from ion shock in reactive ion etching. In order to solve such problems, it should be considered to use magnetron etching equipment having functions so as to apply a uniform voltage on the semiconductor wafer by varying a magnetic field.

Subsequently, a conductive electrode material such as tungsten is embedded by selective CVD under a condition where no tungsten grows on the interlayer insulating layer 9 (FIG. 5 (b)).

Furthermore, the CMP (Chemical Mechanical Polishing) method is employed to polish the tungsten and interlayer insulating layer 9 until the insulating layer 5 is exposed. This polishing causes the embedded tungsten to be cut off by the insulating layer 5 and the side-wall insulating layer 7, thereby forming contacting electrodes 11a and 11b (FIG. 5 (c)). With polishing in the CMP method, where $SiO_2$ formed by the thermal dissociation of the tungsten and TEOS is polished, but silicon nitride, a material for the insulating layer 5, is not polished. Whereas, it is preferable in this embodiment that the silicon nitride works as a stopper layer in the CMP method.

For example, in the initial period of the CMP method, a polishing agent, which mainly consists of persulfuric acid ammonium, allows $SiO_2$ formed by the thermal dissociation of the TEOS to obtain an etching rate equivalent to that of the tungsten. Using this polishing agent, the aforesaid $SiO_2$ and tungsten are polished to the vicinity of the insulating layer 5. Then, the aforesaid $SiO_2$ and tungsten are polished until the surface of the insulating layer 5 is exposed, using a polishing agent which mainly consists of nitric ferrous oxide having a characteristic that an etching amount of etching tungsten is much larger than that of etching silicon dioxide and silicon nitride.

Subsequently, an about 200 nm thick Al (Al-0.5%Cu) layer is deposited on the contacting electrodes 11a and 11b, and on interlayer insulating layer 9 using a high-temperature sputter. Then, the normal lithography method is used to form an etching mask made of materials, such as the resist, on the said Al layer. Next, an anisotropic etching method, such as RIE (Reactive Ion Etching), is employed to form the wiring 12 pattern by etching Al layer, which is not covered by the said etching mask. In such manner, the MOS transistor is completed (FIG. 4 (b)).

As described above, this embodiment is characterized by the fact that only one contacting hole 10 is formed into the interlayer insulating layer. Conventionally, two contacting holes 10a and 10b are formed, one on either end of gate electrode 4. To form these contacting holes, the interlayer insulating layer 9 is etched using an etching mask having a separate opening pattern corresponding to each contacting hole. These contacting holes 10a and 10b are isolated by the interlayer insulating layer 9, which retained on insulating layer 5. In the conventional method, where these contacting holes 10a and 10b are aligned with gate electrode 4, it was required to form the contacting holes 10a and 10b so that the interlayer insulating layer 9, located on the insulating layer 5, could be retained. Hence, it is required to form a pattern narrower than the gate electrode 4, in order to simultaneously open two contacting holes, 10a and 10b.

On the contrary, in this embodiment, where the contacting hole is provided as a certain specific pattern which crosses over the source and drain diffusion layers 8 at both ends of the gate electrode 4, the following problems will not occur, when forming the contacting hole pattern by the etching technique.

1. In a resist baking process, carried out in the course of forming the resist pattern, such as when using etching mask material, a problem occurs wherein a pattern is deformed, due to resist contraction after baking.
2. In resist exposure, as shown above, the exposure region on the resist top surface differs from the exposure region on the resist bottom surface, because optical transitivity is not infinite within resist. For this reason, a problem arises in that an etching mask of the desired pattern size cannot be obtained.
3. Since the contacting hole 10a pattern closes approximate by the contacting hole 10b pattern at etching using the finished mask, as described above, a portion of the interlayer insulating layer 9 remaining on the insulating layer 5 results in the shape shown with dotted line in FIG. 2(b).

Moreover, an electrode material, such as tungsten, is embedded in the contacting hole 10, and the tungsten and the interlayer insulating layer 9 are polished until the insulating layer 5 on the gate electrode 4 is exposed. The polishing causes the contacting electrodes 11a and 11b to be isolated by the insulating layers 5 and 7. Therefore, a portion of the interlayer insulating layer 9 is left on the insulating layer 5, which need not be defined as a boundary between the contacting electrodes 11a and 11b.

In addition, as described above, an etching condition is set so that the etching speed of the insulating layer 5 and the side-wall insulating layer 7 is lower than that for the interlayer insulating layer 9. By carrying out etching under this condition, the insulating layers 5 and 7 can accurately be retained, even if the contacting hole 10 is provided in the interlayer insulating layer 9, using a certain specific etching mask pattern which crosses over the gate electrode. Thus, two contacting electrodes 11 one located at each end of the gate electrode, can be isolated by the insulating layer 5. Furthermore, the gate electrode 4 and the contacting electrode 11 can be isolated by the side-wall insulating layer 7.

Meanwhile, in the conventional method, the interlayer insulating layer 9 on the insulating layer 5 also remains on the side-wall insulating layer 7 and on the semiconductor substrate 1, when an allowance b is not sufficiently secured for the overlay offset between the gate electrode 4 and the contacting holes 10a and 10b. This could result in the possibility that the separation between the gate electrode 4 and the contacting electrode 11 might differ at both ends of the gate electrode 4. Hence, the parasitic resistance on the source region can differ in the parasitic resistance on the drain region. In this embodiment, however, the insulating layer 5 and the side-wall insulating layer 7, the covering gate electrode 4, are exposed at the formation of the contacting hole 10, so that the contacting hole 10 can be accurately aligned with the gate electrode 4, regardless of the overlay offset. As described above, the separation between the contacting electrode 11 and the gate electrode 4 can be kept equal to the side-wall insulating layer 7 width, which can prevent the source and drain regions from differing in parasitic resistance, and can reduce the parasitic resistance as far as possible.

Furthermore, in this embodiment, conductive electrode materials are embedded in the contacting hole 10, and the conductive electrode materials and the interlayer insulating layer 9 are etched until the insulating layer 5 is exposed so that the contacting electrodes 11a and 11b are isolated by the gate electrode 4, insulating layer 5, and the side-wall insulating layer 7. Accordingly, no flattening process is required, because the surface is already made flat after the formation of the contacting electrode 11. In this manner, the process can be simplified in this embodiment.

Meanwhile, this embodiment employed tungsten as a conductive electrode material composing contacting electrode 1, whoever, a polycrystalline silicon layer, to which impurities are added, can also be employed. Moreover, the metal-silicide layer such as WSi, or other metals such as Al and Cu can be employed. When the polycrystalline silicon is employed for contacting electrode 11, it is recommended to employ a material including silica for slurry used in the aforesaid CMP process. This is because silica has a polishing rate equivalent to $SiO_2$ and the polycrystalline silicon formed by thermally isolating TEOS, while the said $SiO_2$ or the polycrystalline silicon has the higher polishing rate selectivity for the silicon nitride layer.

The minimum requirement to prevent a short-circuit occurring due to the upper wiring is that insulating layer 5 should not disappear in order to fabricate the gate electrode and to form the contacting hole 10. In this embodiment, the gate electrode layer thickness is defined as "a", that for the interlayer insulating layer 9 is defined as "b", and that for the insulating layer 5 is defined as "c", and moreover, a CMP over etching amount of the contacting hole 10, the contacting electrode 11, and the interlayer insulating layer 9 are uniformly defined as 50%. Furthermore, a $SiO_2$ selectivity to the silicon nitride layer for the formation of the contacting hole 10 is defined as $\alpha$, and the tungsten selectivity to the silicon nitride layer for polishing the interlayer insulating layer or the contacting electrode materials by CMP is defined as $\beta$.

In order to retain the insulating layer 5 as much as possible, after formation of the contacting hole 10, the following equation must be established:

$$(a+b+c)/2\alpha+b/2\beta<c.$$

on considering the withstand voltage between wirings, current technique requires about 500 Angstroms for insulating layer 9. According to the above equation:

$$(a+b+c)/2\alpha+b/2\beta<c-500.$$

For example, under conditions that a=2000 Angstroms, b=3000 Angstroms, and
the selectivity described above is set;
a=50 and
b=10,
as a result, the following is obtained; 707<c In this case, the deposited layer thickness for the insulating layer 5 will be 707 Angstroms or more.

In the embodiment described above, the contacting electrode 11 consists of tungsten only. However, the contact resistance can be reduced by forming a silicide layer, such as TiSi, between the tungsten and the source or drain diffusion layer.

Figure 6A:
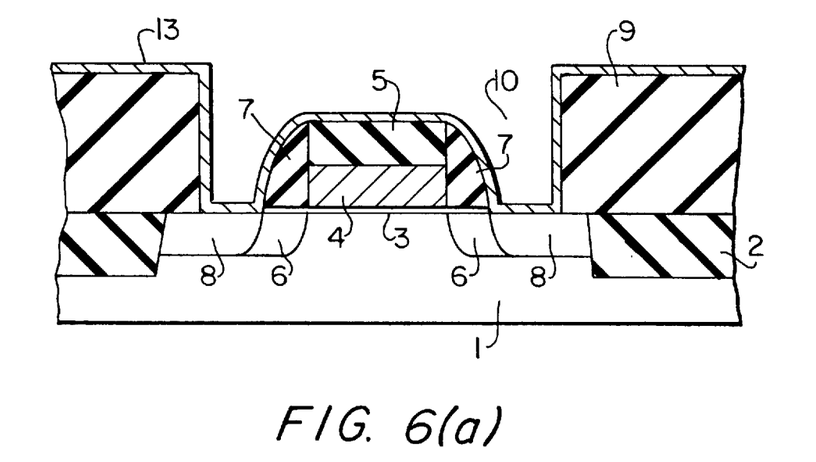
FIGS. 6(a) and 6(b) are sectional views of each step of manufacturing a semiconductor device according to a second embodiment.
Figure 6B:
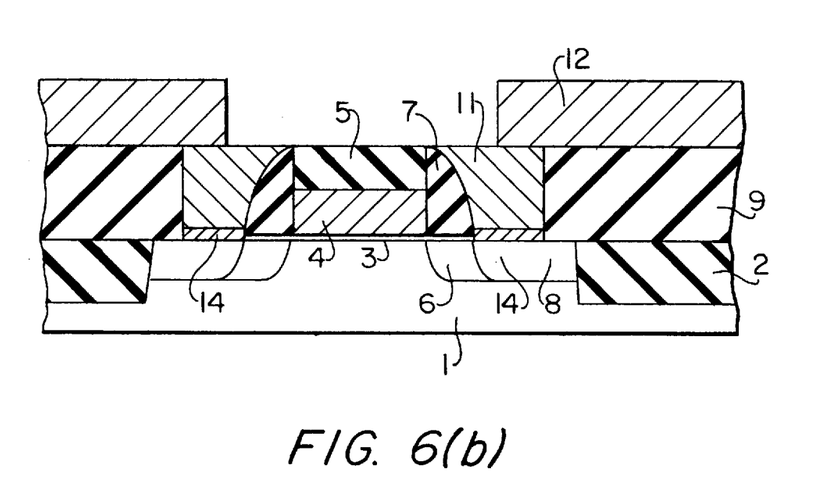

FIG. 6 shows the second embodiment for the manufacturing method used for the semiconductor equipment in such a case. The gate electrode 4, the insulating layers 5 and 7, and the interlayer insulating layer 9 are formed on the semiconductor substrate 1, a pattern across both ends of gate electrode 4 is employed to etch the interlayer insulating layer 9, and the same processes are implemented as in the first embodiment, until the surfaces of the insulating layer 5, and the source or drain diffusion layer 8, are exposed.

Subsequently, Ti 13, for example, is deposited on the exposed source and drain diffusion layers 8, the insulating layer 5, the side-wall insulating layer 7 and interlayer insulating layer 9 (FIG. 6 (a)). Next, the contacted semiconductor substrate 1 is reacted with Ti13 by thermal treatment, thereby forming TiSi in the bottom surface (where source and drain diffusion layers 8 are exposed) of the contacting hole 10.

Then, only Ti is etched with an etching solution that does not etch TiSi. In the above manner, silicide layer 14 is formed on the portion where the source and drain diffusion layers 8 are exposed.

Further, tungsten is embedded in the contacting hole 10 as in the above embodiment, composing the contacting electrode 11 with TiSi and the tungsten. Furthermore, the Al wiring 12, for example, is formed to complete a MOS transistor (FIG. 6 (b)).

In such a manufacturing method, the silicide layer 14 is formed between the tungsten 11 (contacting electrode materials) and the diffusion layer 8 on the semiconductor substrate 1, so that the contacting resistance and the parasitic resistance for the source and drain regions can be reduced, in addition to the effect brought out by the first embodiment.

When Al is employed as a conductive electrode material to compose the contacting electrode 11, a barrier metal layer, such as TiN, can be formed at least on the source and drain diffusion layers 8 to prevent Si from precipitating in Al and Al from projecting out from the source and drain diffusion layers 8. Here, it is not only possible for the barrier metal layer to be selectively formed on the diffusion layers 8, as in the said silicide layer 14, but it can also be formed on the side-wall of the contacting hole 10, the interlayer insulating layer 9, the insulating layers 5 and 7 in addition to the diffusion layer 8. In this case, for example, when the surface of the insulating layer 5 is exposed by polishing a conductive electrode material, such as Al and the interlayer insulating layer 9, the barrier metal layer on the interlayer insulating layer 9 and insulating layer 5 is removed at the same time. Therefore, the contacting electrodes 11a and 11b do not short-circuit. The barrier metal layer is formed in this manner, thereby preventing Si in the semiconductor substrate from precipitating in the contacting hole, and reducing the contacting hole resistance. Moreover, it prevents Al from projecting out from the source and drain diffusion layers 8, thereby preventing the contacting electrode 11 and the semiconductor substrate 1 from short-circuiting.

As obviously stated above, in the manufacturing method for semiconductor equipment according to the present invention, the contacting holes, located on both ends through a gate electrode, are aligned with the gate electrode, thereby reducing the parasitic resistance due to the diffusion layer of the semiconductor equipment and miniaturizing the semiconductor equipment.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A method of manufacturing a semiconductor device, comprising the steps of:

forming an opening in a first insulating layer covering a second insulating layer and a surface of semiconductor substrate, so that the second insulating layer covering a gate electrode, and a surface of a source region and a drain region are exposed;

burying a conductive material in the opening; and etching the conductive material so that a surface of the second insulating layer is exposed.

2. The method of manufacturing a semiconductor device according to claim 1, wherein a speed of etching the first insulating layer is faster than a speed of etching the second insulating layer.

3. The method of manufacturing a semiconductor device according to claim 1, wherein the opening is made by an anisotropic etching method using an etching mask having a first opening over the gate electrode.

4. The method of manufacturing a semiconductor device according to claim 1, wherein the first insulating layer is a silicon dioxide ($SiO_2$) layer made from TEOS (tetraethoxysilane).

5. The method of manufacturing a semiconductor device according to claim 1, wherein the second insulating layer is made from silicon nitride.

6. The method of manufacturing a semiconductor device according to claim 1, wherein the etching step is accomplished by a CMP (chemical mechanical polishing).

7. A method of manufacturing a semiconductor device, comprising the steps of:

depositing a material of gate electrode on a gate insulating film;

depositing a first insulating layer on the material of gate electrode;

forming a gate electrode by etching the material of gate electrode and the first insulating layer;

forming a second insulating layer along a side surface of the gate electrode;

forming a source region and drain region in a surface of the semiconductor substrate;

depositing a third insulating layer over the gate electrode and the semiconductor substrate;

forming an opening in the third insulating layer so that the first and second insulating layer and a part of a surface of the source region and a part of a surface of the drain region are exposed;

burying a conductive material in the opening; and dividing the conductive material into two portions by etching the conductive material so that a surface of the second insulating layer is exposed.

8. The method of manufacturing a semiconductor device according to claim 7, wherein a speed of etching the first insulating layer and the second insulating layer is faster than a speed of etching the third insulating layer.

9. The method of manufacturing a semiconductor device according to claim 7, wherein a total thickness of the gate electrode and the first insulating layer is equal to a thickness of the third insulating layer.

10. The method of manufacturing a semiconductor device according to claim 7, wherein the dividing step is accomplished by a CMP (chemical mechanical polishing).

11. The method of manufacturing a semiconductor device according to claim 7, further comprising the step of;

forming a conductive film on the part of the surface of the source region and on the part of the surface of the drain region.

12. The method of manufacturing a semiconductor device according to claim 11, wherein the conductive material is made of a metal having a high melting point, and the conductive layer is made of a silicide.

13. The method of manufacturing a semiconductor device according to claim 11, wherein the conductive material is made of an aluminum, and the conductive layer is made of a barrier metal.

* * * * *